United States Patent [19]
Boyd et al.

[11] Patent Number: 5,788,143
[45] Date of Patent: Aug. 4, 1998

[54] SOLDER PARTICLE DEPOSITION

[75] Inventors: Alexander Boyd, Largs; William French, Glasgow; Stuart P. Lees; Kenneth Skene Murray, both of Renfrewshire; Brian L. Robertson, Gourock, all of Scotland

[73] Assignee: International Business Machines Corporation, Armonk, N.Y.

[21] Appl. No.: 399,265

[22] Filed: May 17, 1995

Related U.S. Application Data

[63] Continuation-in-part of Ser. No. 099,689, Jul. 29, 1993, Pat. No. 5,445,313.

[30] Foreign Application Priority Data

Apr. 8, 1992 [GB] United Kingdom ............... 9216526

[51] Int. Cl.⁶ .................................................. H05K 3/34
[52] U.S. Cl. .................................. 228/253; 228/180.22
[58] Field of Search ................................ 228/135, 175, 228/180.22, 207, 223, 224, 246, 248.1, 253, 254; 438/119, 613

[56] References Cited

U.S. PATENT DOCUMENTS

| | | |
|---|---|---|
| 3,453,714 | 7/1969 | Clark et al. ............... 29/740 |
| 3,499,203 | 3/1970 | Clark et al. ............... 29/740 |
| 3,719,981 | 3/1973 | Steitz . |
| 4,241,112 | 12/1980 | Kostandov et al. . |
| 4,332,341 | 6/1982 | Minetti ............... 228/180.22 |
| 4,462,534 | 7/1984 | Bitaillou et al. . |
| 4,752,027 | 6/1988 | Gschwend ............... 228/180.2 |
| 4,871,110 | 10/1989 | Fukasawa et al. . |
| 5,088,639 | 2/1992 | Gondotra et al. . |
| 5,118,027 | 6/1992 | Braun et al. . |
| 5,147,084 | 9/1992 | Behun et al. . |
| 5,201,451 | 4/1993 | Desai et al. . |
| 5,205,896 | 4/1993 | Brown et al. . |
| 5,219,117 | 6/1993 | Lin . |
| 5,255,839 | 10/1993 | Alves et al. . |
| 5,255,840 | 10/1993 | Nowotarski ............... 228/254 |

FOREIGN PATENT DOCUMENTS 0263222  4/1988  European Pat. Off. .

OTHER PUBLICATIONS

IBM Research Disclosure, Nov., 1986, No. 271, "Solder Ball Alignment Device", by Curtis et al., #27109.

IBM Technical Disclosure Bulletin Vol. 20, No. 8, Jan., 1978, "High Performance Package", by Berndlmaier et al.

*Primary Examiner*—Samuel M. Heinrich
*Attorney, Agent, or Firm*—Douglas M. Clarkson

[57] ABSTRACT

Solder particles 220 are deposited onto metallized contacts of a direct chip attach (DCA) site located on a substrate 301. The contacts 302 are coated with a layer of flux 303. A pick up head 211 is positioned in a reservoir 201 of solder particles 220 and particles are attracted to the apertures in the end 213 of the head. The apertures have an arrangement corresponding to the footprint of the metallized contacts on the substrate. The head 211 is positioned adjacent the substrate 301 and the particles 220 released. The particles 220 stick to the flux 303 coated on the contacts 302. The particles are reflowed, leveled and again coated with flux. An integrated circuit chip is then placed on the leveled reliefs 501 and the reliefs reflowed again to attach the chip onto the contacts 302.

12 Claims, 5 Drawing Sheets

SOLDER PARTICLE DEPOSITION

This application is a continuation in part of application Ser. No. 08/099,689 filed Jul. 29, 1993, now U.S. Pat. No. 5,445,313.

FIELD OF THE INVENTION

This invention relates to attachment of integrated circuits to substrates in electronic equipment and more particularly to attachment of direct chip attach (DCA) integrated circuits (or chips) to printed circuit boards using solid solder particles.

BACKGROUND OF THE INVENTION

Presently, DCA chips are bonded to metallized contacts (DCA sites) arranged on substrates such as printed circuit boards (PCB's) by applying molten solder particles to a substrate, flattening the particles, applying sticky flux to the substrate, placing components (DCA chips) onto the flattened particles and reflowing the joints.

IBM Research Disclosure 27109 describes a tool for placing solid solder balls on a ceramic surface solder device. The balls are of the order of 0.625 mm diameter. The ceramic surface mount device is screen printed with sticky solder paste only at contact sites and the device positioned above a template having an arrangement of apertures containing balls positioned to correspond to the sticky solder paste sites. The balls are held in place on the template by gravity with assistance from a vacuum, which is released to allow the sticky solder paste on the surface mount device to extract the balls from the template. The use of a template with a vacuum also aids the installation of the balls onto the template as the balls are simply spilled over and fall into place on the template.

DCA sites have contacts at a very fine pitch, so it is critical that an exact volume of solder is deposited onto the DCA sites to form a joint. Too little solder will result in an open circuit, while too much solder will result in a short circuit. Another problem is that solder pastes cannot be readily printed to such a fine pitch, as clogging of the apertures used for printing results. In addition, paste registration to DCA sites over a whole substrate would be impossible.

A repair of an open circuit or a short circuit contact for this technology is difficult so a method that can guarantee accurate deposition volume to minimize repair activity is desired. Deposition of molten solder requires an inner and outer mask to be accurately aligned to each other, and then the combination aligned to the DCA site. The alignment of the inner and outer masks is both difficult and time consuming with no guarantee that the finished mask will give the required volumes on all DCA sites. Other variable parameters which must be precisely controlled include the thickness of inner and outer masks used to deposit the molten solder, hole size of the inner mask, stand off height of the outer mask and the air pressure which forces molten solder through the masks.

U.S. Pat. No. 5,088,639 to Gondotra discloses a multi-point soldering process in which a vacuum pickup tool attached to a robot gripper simultaneously picks up a plurality of solder balls from a oscillating reservoir. A vision system determines that each pickup element has a solder ball, then the balls are dipped in sticky flux and deposited onto a circuit board at interconnection locations by releasing the vacuum. Then a plurality of individual heating elements are placed on the circuit board conforming to the interconnections and the balls are simultaneously soldered to the interconnections.

U.S. Pat. No. 5,205,896 to Brown discloses a vacuum chamber with a bottom wall of a rigid porus material covered by a foil with a pattern of holes or a thicker more rigid, self supporting member with a hole pattern drilled therein. The rigid member is positioned over a speaker cone which contains spherical solder preforms in the range of 0.254 mm in diameter which are vibrated by the speaker. The preforms are melted to form solder bumps which may be used in a conventional manner to attach leadless chip carriers.

U.S. Pat. No. 5,201,451 to Desai, discloses connecting copper or solder balls to a flexible chip carrier.

U.S. Pat. No. 5,147,084 to Behun, discloses a connector structure in which low melting temperature solder connects high melting temperature balls to a substrate.

U.S. Pat. No. 4,752,027 discloses the screening of solder paste and IR reflowing to form solder bumps. Then the bumps are flattened and adhesive flux is rolled onto the bumps and then surface mount components are placed and reflow connected.

U.S. Pat. No. 4,462,534 in FIG. 4B shows a suction device which sucks up the moving solder balls contained in a vibrating bowl and dispenses to the previously fluxed substrate.

U.S. Pat. No. 4,241,112 discloses "stirring [of solids] if effected with use of vibration boiling, gravity pouring, fluidized bed, and mechanical, vibrator, or pneumatic means."

U.S. Pat. No. 3,719,981 to Steits discloses placing solder balls on solder bumps on a silicon wafer for producing direct connect chips.

Published European Application 0,263,222 to Alexis Bitaillou discloses solder balls placed on a metalized ceramic substrate to form a pinless ceramic module.

"High Performance Package" in *IBM Technical Disclosure Bulletin*, Vol. 20, No. 8, January 1978, discloses Au or Cu balls used to form a pinless module.

Research Disclosure AT885-0352 P100 02-250 02-330 discloses aligning a template which holds solder balls in position using a vacuum, with electrical contacts of a ceramic substrate which have solder paste thereon.

U.S. Pat. No. 4,871,110 to Fukasawa et al, discloses a method for aligning solder balls and stacking solder balls onto the electrodes of a chip of connection pads of a substrate.

U.S. Pat. No. 5,219,117 to Lin, discloses solder ball transfer onto a semiconductor device using a non-solder-wettable silicon substrate having recesses to align and contain the solder balls.

U.S. Pat. No. 5,255,839 to de Costa Aleves, et al, discloses a method for applying solder on a substrate by applying flux and tacking media between solder pads and solder spheres prior to reflow.

SUMMARY OF THE INVENTION

The invention provides a method of depositing solder from a reservoir onto metallized contacts arranged on a surface via a pick-up head comprising applying flux to the contacts, picking up solder in the form of particles from the reservoir with the pick-up head, the head having apertures corresponding to the arrangement of the contacts, positioning the head adjacent the contacts, aligning the apertures with the contacts, and releasing the particles onto the surface, the particles being retained on the surface by the flux.

Preferably, the method further comprises, after releasing the particles, reflowing the solder particles, leveling the reflowed particles with a flattened head to form reliefs, applying flux to the reliefs, placing integrated circuit contacts onto the reliefs, and reflowing the reliefs to attach the chip to the surface. The pick-up head preferably picks up and releases the solder particles by applying and releasing a vacuum. The solder particles are preferably maintained in a fluidized form while being held in the reservoir. This prevents the solder particles sticking together.

In a preferred embodiment of the present invention, there is provided an apparatus for depositing solder from a reservoir onto metallized contacts on a surface comprising means for supplying a surface, the surface having a plurality of contacts arranged thereon, to the apparatus, a reservoir for containing solder particles, the particle size corresponding to the size of the contacts, means for producing a vacuum, a pick-up head having a connection for the vacuum producing means and a plurality of apertures smaller in size than the solder particles and having an aperture configuration corresponding to the arrangement of the plurality of contacts, the head being capable of being positioned in a first position adjacent the reservoir and a second position adjacent the surface, means for dispensing flux onto the contacts, control means for causing the head to transport the particles from the reservoir to the surface, means for aligning the apertures with the contacts and means for controlling the vacuum to the pick up head.

Preferably, the apparatus further comprises a rotating turret with the heads positioned circumferentially. The turret has an indexing system and is computer controlled.

BRIEF DESCRIPTION OF THE DRAWINGS

Preferred embodiments of the invention will now be described, by way of example only, with reference to the accompanying drawings, with like components in different figures being referenced by like reference numerals, in which.

DETAILED DESCRIPTION OF THE INVENTION

The manufacture of solder particles of the required size (approximately 0.125 mm) to a tight tolerance (±0.0125 mm) is well known. The present invention uses particles of this size in place of the molten solder used in prior art solder depositing systems.

Figure 1:
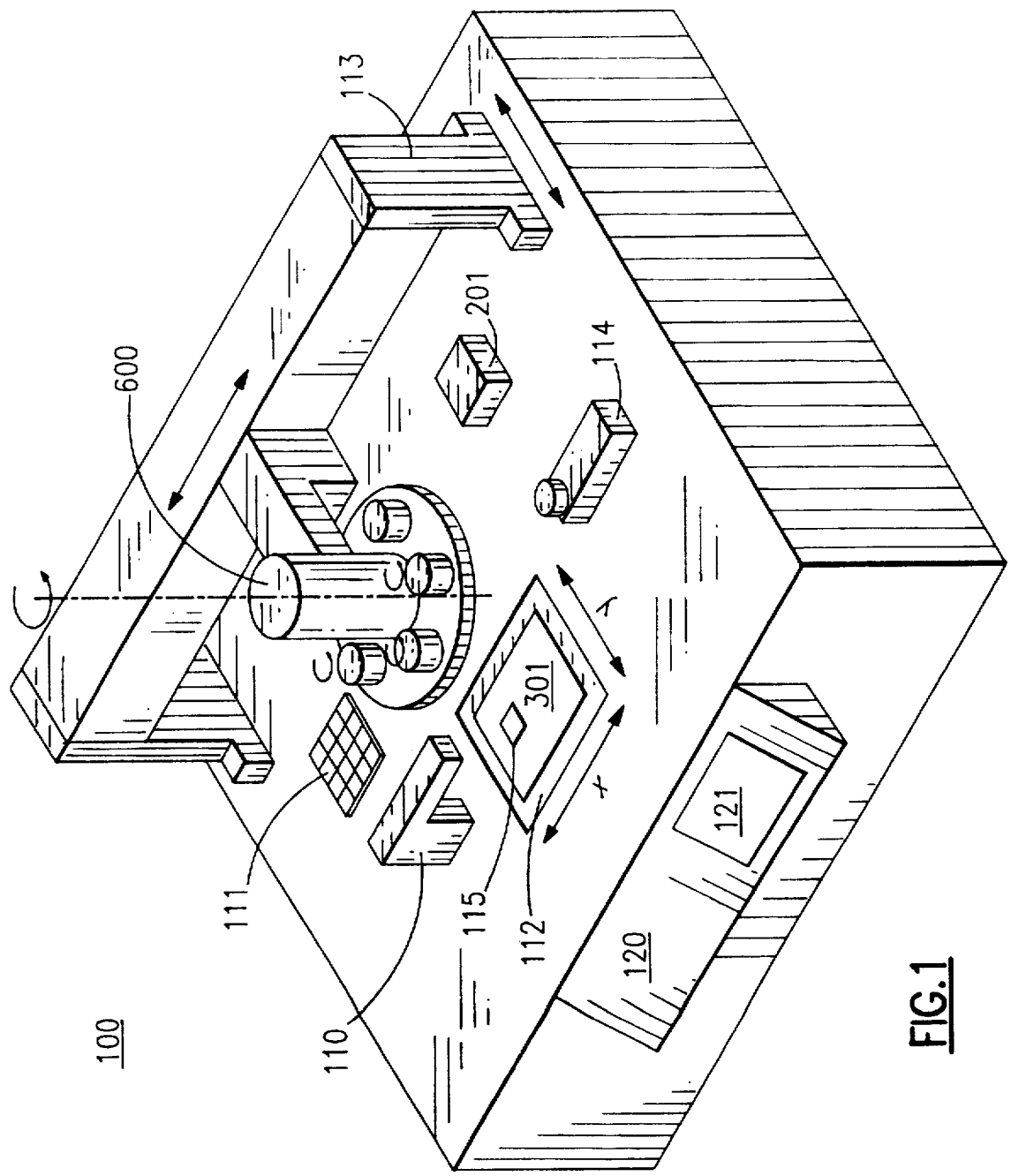
FIG. 1 is an overall view of an embodiment of the invention.

FIG. 1 shows an overall view of an embodiment of the invention, the apparatus being indicated by reference numeral 100. The apparatus comprises an indexing turret head 600 containing various heads (described later with reference to FIG. 6) including a vacuum pick up head (211 in FIG. 2), a component bank 111 containing DCA chips 115, a programmable Cartesian coordinate gantry 113 for positioning the heads contained within the indexing turret head 600 in position over a substrate 301. It also comprises two vision systems, the first 110 being used for alignment of the DCA site on the substrate 301, the second 114 being used for positioning and alignment of the pick-up head and the DCA chip site. The substrate is positioned under the vision system 110 using a programmable "XY" table 112.

Figure 2:
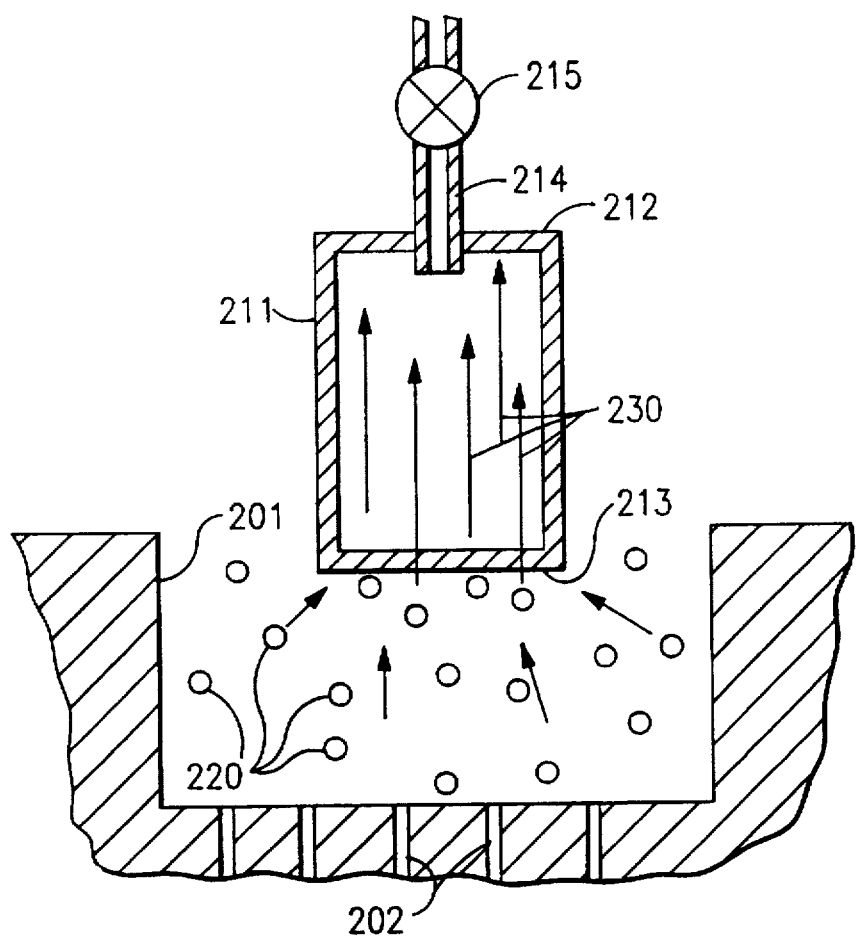
FIG. 2 is a cross-section view of a pick-up head and a solder reservoir used in the apparatus of FIG. 1.

FIG. 2 shows a vacuum pick-up head 211 having at a first end 213 a template having apertures. These apertures have a footprint corresponding to the footprint of a DCA chip site on a substrate. A second end 212 of the head has a tube 214 which connects via a control means 215 to a vacuum pump (not shown). There is also a reservoir 201 of solder particles 220 in the form of a fluidized bed 202. A fluidized bed is used because the solder particles 220 being very small tend to stick together. The means for achieving a fluidized bed 202 of solder particles 220 are similar to that used for many other types of small particles and so will not be described further. The pick-up head 211 initially has no suction applied via control means 215 and tube 214 from the vacuum pump. The pick-up head 211 is lowered into the reservoir 201 and the suction from the vacuum pump applied via the control means 215 and tube 214. Air flows into the pick-up head 211 through the apertures in the first end 213 and solder particles 220 are attracted from the reservoir 201 to engage with holes in the template at the first end 213 of the head 211.

Figure 3:
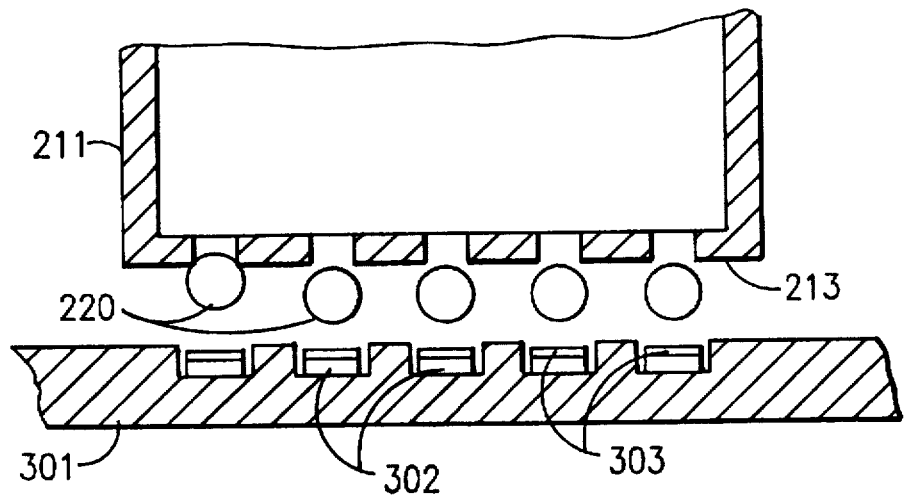
FIG. 3 is a diagram of the head of FIG. 2 with solder particles held by vacuum positioned over a substrate.

FIG. 3 shows the particles 220 held in position against the first end 213 of the head 211 by the vacuum which continues to be applied. The pick up head 211 now transports the solder spheres 220 to the substrate 301 where a machine vision system (110) is used to align the hole pattern in the template with the metallized contacts 302 on the DCA chip site. As described earlier the metallized contacts 302, together with the rest of the substrate, were sprayed with a layer of flux 303. For clarity the sticky flux has been shown only on the contacts of the DCA site. Also described earlier, these holes have a pattern corresponding to the footprint of the DCA chip site. FIG. 3 shows the pick up head 211 after the holes in the template have been aligned with the footprint of the DCA chip site. The pick-up head 211 is then positioned so that it is spaced approximately 0.075 mm from the surface of the substrate 301.

Figure 4:
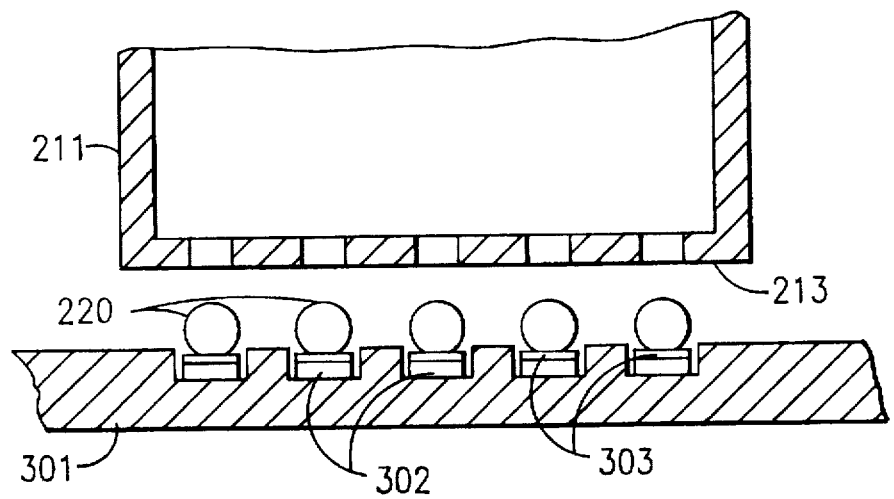
FIG. 4 is a diagram of the head of FIG. 3 after release of the vacuum.

FIG. 4 shows the vacuum released so that the particles 220 fall under the influence of gravity onto contacts 302 of the DCA chip sites. The particles 220 are retained on the chip sites by the sticky flux 303 sprayed earlier onto the whole of the DCA site.

Figure 5:
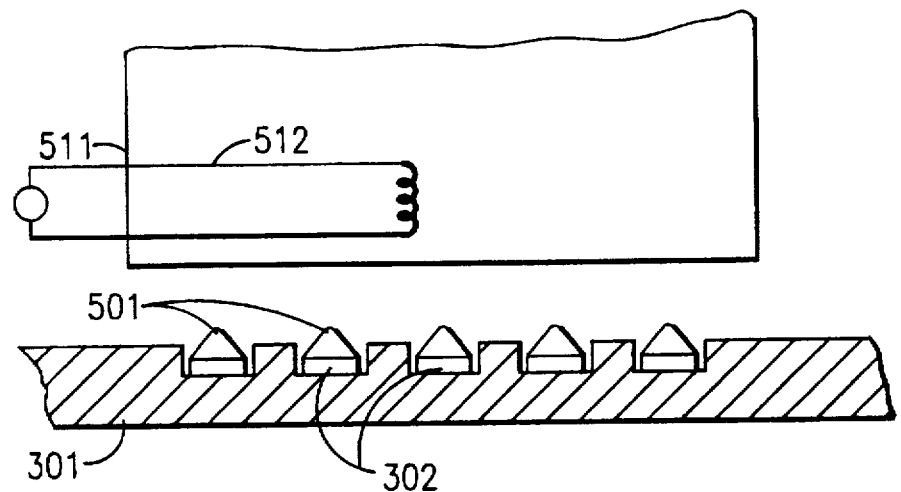
FIG. 5 is a diagram of the reflowing of the solder particles.

The pick-up head 211 is now removed from its position near to the DCA site and a reflow head 511, such as that shown in FIG. 5, containing a heat source 512 is positioned over the site. Heat is applied from the reflow head to the solder particles. The reflow head is moved away from the site and a flattening head (not shown) is then positioned above the DCA site and used to level the molten solder particles 501 into reliefs in the form of flattened bumps.

An aerosol fluxing head such as the one used earlier is now positioned over the DCA site and flux is again sprayed over the whole of a single DCA site from the aerosol head.

A placement head picks up a chip from a component bank and transports the chip from the component bank to a position above the DCA site. The chip contacts are then aligned with the flattened reliefs located on the footprint of the DCA site and the chip placed onto the DCA site. The chip is retained in place by the sticky flux sprayed earlier over the whole of the DCA site. A reflow head 511 such as the one used earlier is now used to reflow the flattened reliefs and attach the chip to the metallized contacts 302 on the substrate 301.

Figure 6:
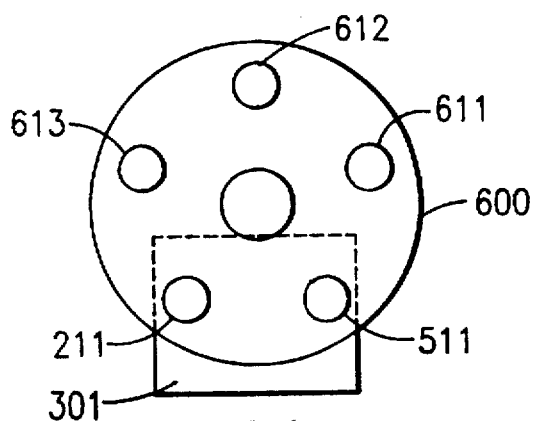
FIG. 6 is a diagram of another embodiment of the invention including an indexing turret.

FIG. 6 shows an indexing turret head 600 used in a further embodiment of the invention. The indexing head contains an aerosol fluxing head 613, a vacuum pick up head 211, a reflow head 511, a flattening head 611 and a placement head 612.

An enhancement to the embodiments described includes the use of positive pressure applied to the pick-up head 211 to assist ejection of the solder particles 220 onto the DCA chip site contacts 302.

Figure 7:
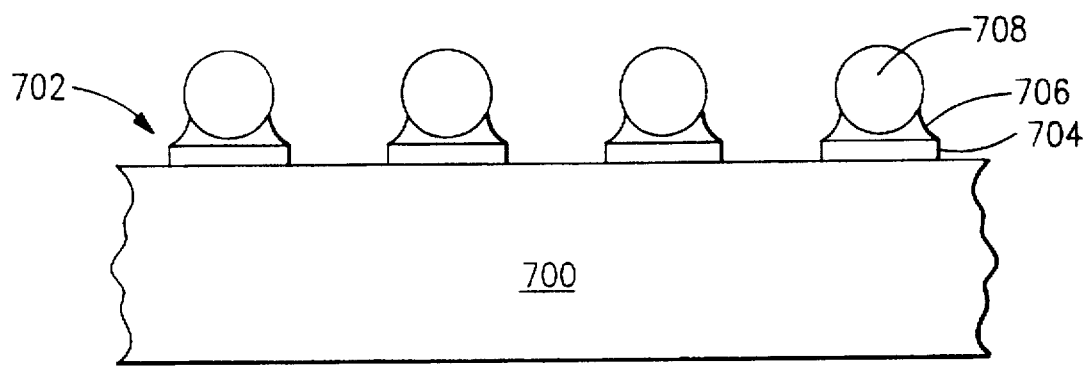
FIG. 7 shows the circuit board assembly of the invention.

FIG. 7 shows a substrate 700 such as a direct connect chip or ball grid array chip carrier with a pattern of metal contact pads 702 which consist of a layer 704 of high melting temperature metal such as copper, aluminum, silver, or lead rich solder and a conforming layer 706 of conductive adhesive or low melting temperature metal such as eutectic Pb/Sn solder which is wetable to the high melting temperature metal. A preform 708 such as a ball of a high melting temperature metal such as Pb/Sn solder with 90-97% Pb, which is wettable by the conforming layer is placed on the contact pads. During placement, curing, or reflow the conforming layer changes shape to conform to the surfaces of the pad and preform and connects the preforms to the pads.

Figure 8:
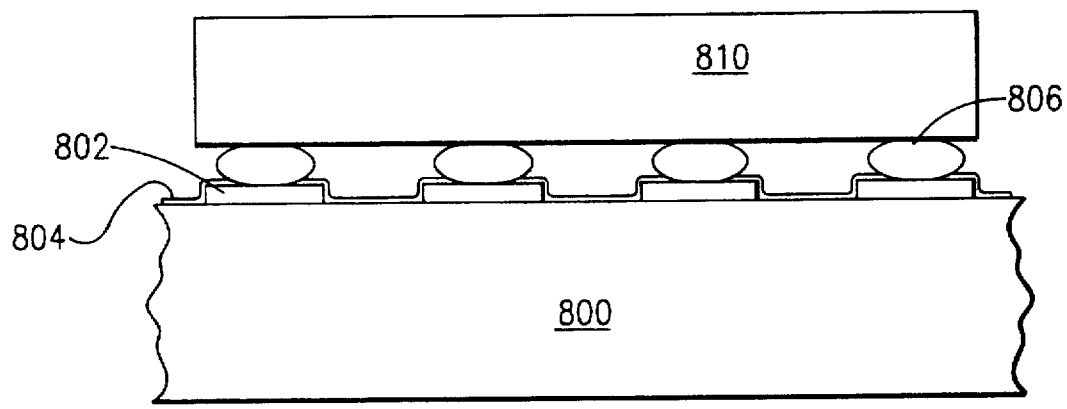
FIG. 8 shows the flattening head of the invention.

FIG. 8 shows a substrate 800 with a pattern of metal contact pads 802 over which a sticky flux 804 has been sprayed. Metal balls 806 such as solder or copper preforms have been positioned on each pad and are mechanically flattened by leveling head 810 as shown.

Figure 9:
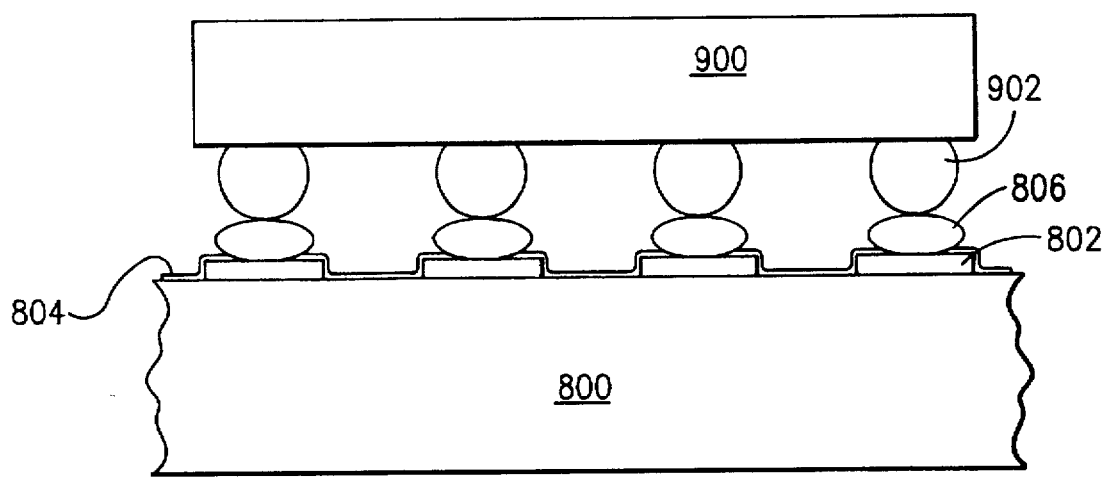
FIG. 9 shows a module of the invention.

FIG. 9 shows leads 902 of a surface mount component 900 such as a direct attach chip or ball grid array chip carrier module, are positioned on the metal balls. During reflow the solder 806 wets the pad and lead to connect the lead to the pad after cooling.

Figure 10:
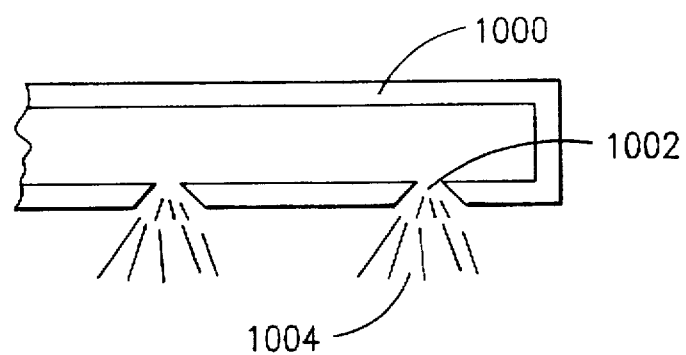
FIG. 10 shows the aerosol flux sprayer of the invention.

FIG. 10 shows conduit 1000 having spray nozzles 1002 for dispensing a fine mist 1004 of flux such as a no clean flux with an alcohol or water carrier.

Figure 11:
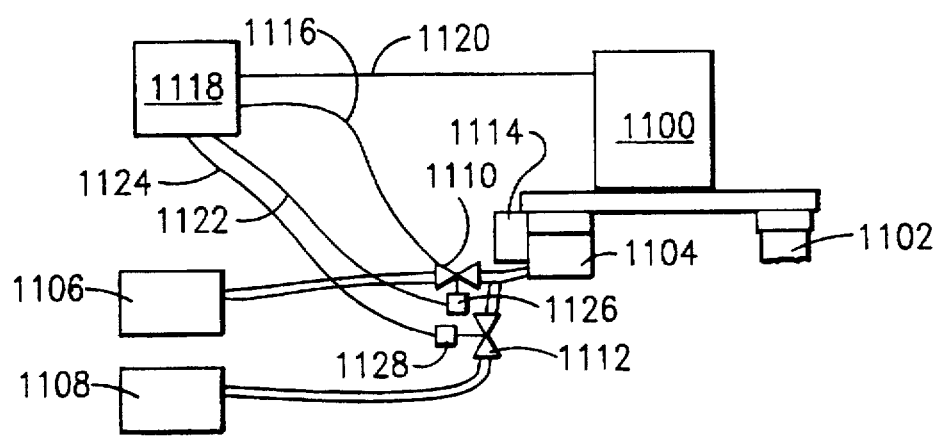
FIG. 11 shows the control system of the invention.

FIG. 11 shows a movement control system such as a robot or turret head 1100 for moving spray head 1102 and vacuum suction head 1104. A source of vacuum 1106 such as a vacuum pump and a source of positive pressure 1108 such as a compressor are connected by hoses with the suction head through valves 1110 and 1112 respectively. A vision system including a source of radiation and a focused detector such as a camera 1114 is connected 1116 with a computer controller 1118. The computer controller is connected 1120 to automatically move the robot 1100 to produce circuit boards depending on signals from the machine vision system. Computer 1118 is connected at 1122 and 1124 to control valve motors 1126 and 1128 respectively for valves 1110 and 1112 respectively.

In the invention of Applicant's it is preferred that the metal balls are agitated by the formation of a fluidized bed of particles, but alternately the balls could be agitated by applying sound, vibration, or other forces to the particles within the reservoir.

We claim:

1. A method of making an electrical interconnect assembly, said method comprising the steps of:

providing a substrate having a surface having a metal wiring layer thereon and including a pattern of metal contact pads as part thereof;

positioning a sticky material layer on selected ones of said metal contact pads;

positioning a metal preform above respective ones of said selected ones of said metal contact pads having said sticky material layer thereon, and thereafter releasing said metal preform to drop onto said sticky material layer on said selected ones of said metal contact pads; and substantially flattening said metal preform while said metal preform is positioned on said sticky layer.

2. The method of claim 1 wherein said selected ones of said metal contact pads of said wiring layers on said substrate are provided from high melting temperature metal.

3. The method of claim 1 wherein said sticky material is provided from a solder flux material.

4. The method of claim 1 wherein said sticky material is positioned on said selected ones of said metal contact pads and also onto said surface of said substrate.

5. The method of claim 4 wherein said sticky layer is positioned on said selected ones of said metal contact pads and also onto said surface of said substrate utilizing a spray mist application.

6. The method of claim 5 wherein said spray mist application is accomplished by using an aerosol spray nozzle device.

7. The method of claim 5 wherein said spray mist application utilizes a no-clean flux material with an alcohol carrier.

8. The method of claim 5 wherein said spray mist application utilizes a no-clean flux material with a water carrier.

9. The method of claim 1 wherein said metal preform is provided from low melting temperature metal.

10. The method of claim 1 wherein said metal preform is provided from high melting temperature metal.

11. The method of claim 1 wherein said positioning of said metal preform above said sticky layer and said releasing and dropping of said preform includes the step of exerting a predetermined pressure onto said preform.

12. The method of claim 1 further including the step of positioning an electrical component lead in contact with said metal preform subsequent to said flattening thereof and electrically coupling said lead to said preform.

* * * * *